(12) United States Patent
Matijasevic et al.

(10) Patent No.: US 7,569,494 B2
(45) Date of Patent: Aug. 4, 2009

(54) APPARATUS AND METHOD FOR DEPOSITION OF THIN FILMS

(75) Inventors: Vladimir Matijasevic, Bremen (DE); Todd Kaplan, Los Angeles, CA (US)

(73) Assignee: Conductus, Inc., Santa Barbara, CA (US)

( * ) Notice: Subject to any disclaimer, the term of this patent is extended or adjusted under 35 U.S.C. 154(b) by 0 days.

(21) Appl. No.: 10/300,413

(22) Filed: Nov. 19, 2002

(65) Prior Publication Data

US 2003/0073324 A1    Apr. 17, 2003

Related U.S. Application Data

(62) Division of application No. 09/501,042, filed on Feb. 9, 2000, now Pat. No. 6,527,866.

(51) Int. Cl.
*H01L 21/31* (2006.01)
(52) U.S. Cl. .................. 438/762; 438/770; 505/826
(58) Field of Classification Search ........... 438/762, 438/763, 765, 908, 758, 770; 204/192.1, 204/192.11, 192.12, 192.15; 505/826
See application file for complete search history.

(56) References Cited

U.S. PATENT DOCUMENTS

| | | | | |
|---|---|---|---|---|
| 4,851,095 | A | * | 7/1989 | Scobey et al. ........... 204/192.12 |
| 5,124,013 | A | * | 6/1992 | Seddon et al. .......... 204/192.12 |
| 5,154,810 | A | | 10/1992 | Kamerling et al. |
| 5,554,224 | A | | 9/1996 | Foltyn |
| 5,618,388 | A | | 4/1997 | Seeser et al. |
| 5,674,813 | A | * | 10/1997 | Nakamura et al. .......... 505/473 |
| 5,790,304 | A | * | 8/1998 | Sanders et al. .............. 359/361 |
| 5,935,337 | A | | 8/1999 | Takeuchi et al. |
| 6,090,247 | A | * | 7/2000 | White et al. ........... 204/298.26 |

(Continued)

FOREIGN PATENT DOCUMENTS

DE    198 11 293 A1    10/1998

(Continued)

OTHER PUBLICATIONS

Berberich, P. et al., "Homogenous High Quality YBa$_2$Cu$_3$O$_7$ Films on 3" and 4" Substrates," *Physica C*, vol. 219, pp. 497-504 (1994).

(Continued)

*Primary Examiner*—Brook Kebede
(74) *Attorney, Agent, or Firm*—Merchant & Gould P.C.

(57) ABSTRACT

An apparatus for forming a multicomponent thin film, such as a superconducting thin film, on a substrate includes a holder for holding at least one substrate and a deposition/reaction vessel. The deposition/reaction vessel has at least three zones, each zone being separated from adjacent zones by a wall. The zones include at least two deposition zones, where each deposition zone is configured and arranged to deposit a deposition material on the at least one substrate, and at least one reaction zone for reacting the deposition material with a reactant. The apparatus is configured and arranged to rotate the at least one substrate sequentially through the plurality of zones to form a thin film on the substrate. In some embodiments of the apparatus, the deposition/reaction vessel includes a same number of deposition zones and reaction zones which may be alternating deposition and reaction zones.

5 Claims, 7 Drawing Sheets

U.S. PATENT DOCUMENTS 6,103,320 A * 8/2000 Matsumoto et al. ......... 427/535
6,294,025 B1 9/2001 Kinder

FOREIGN PATENT DOCUMENTS

| EP | 0 328 257 A2 | | 8/1989 |
| EP | 0 945 523 A1 | | 9/1999 |
| JP | 06291375 | | 10/1994 |
| WO | WO 90/07019 | * | 6/1990 |
| WO | WO 98/20521 | | 5/1998 |

OTHER PUBLICATIONS

Kinder, H. et al., "Double Sided YBCO Films on 4" Substrates by Thermal Reactive Evaporation," *IEEE Transactions on Applied Superconductivity*, vol. 5, No. 2, pp. 1575-1576 (Jun. 1995).

Kinder, H. et al., "Very Large Area Double Sided Evaporation of High Quality YBCO Films," *The 1995 International Workshop on Superconductivity Co-Sponsored by ISTEC and MRS*, 3 pgs. (Jun. 18-21, 1995).

* cited by examiner

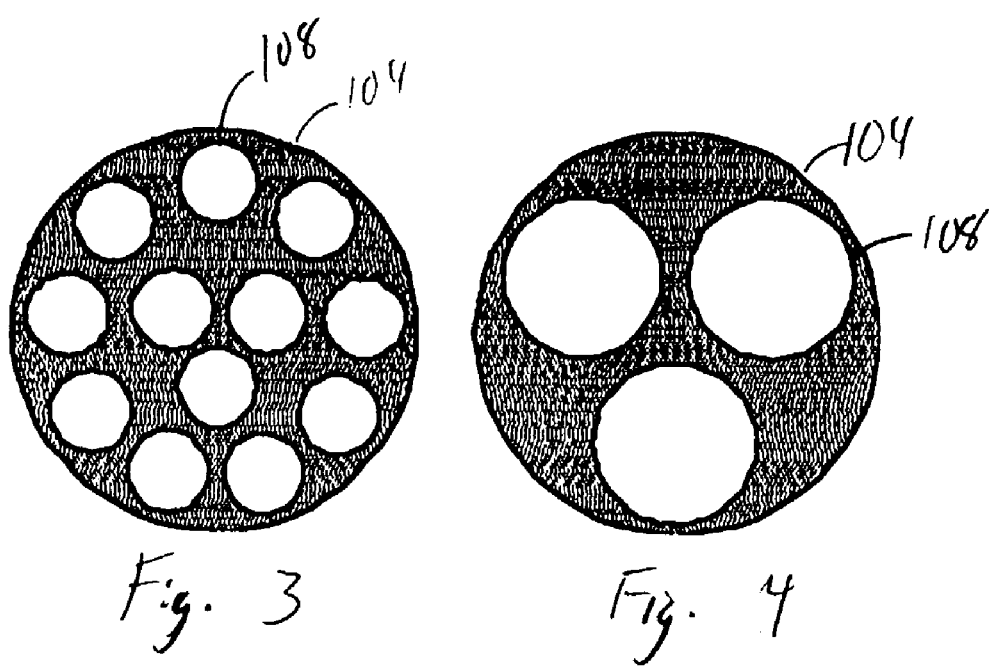

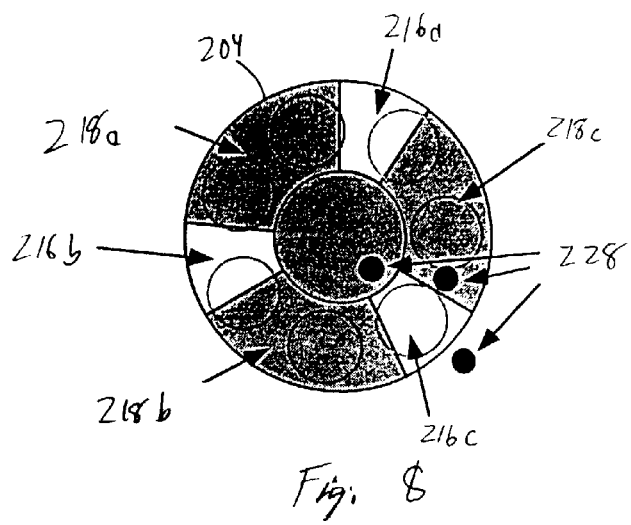
Fig. 8
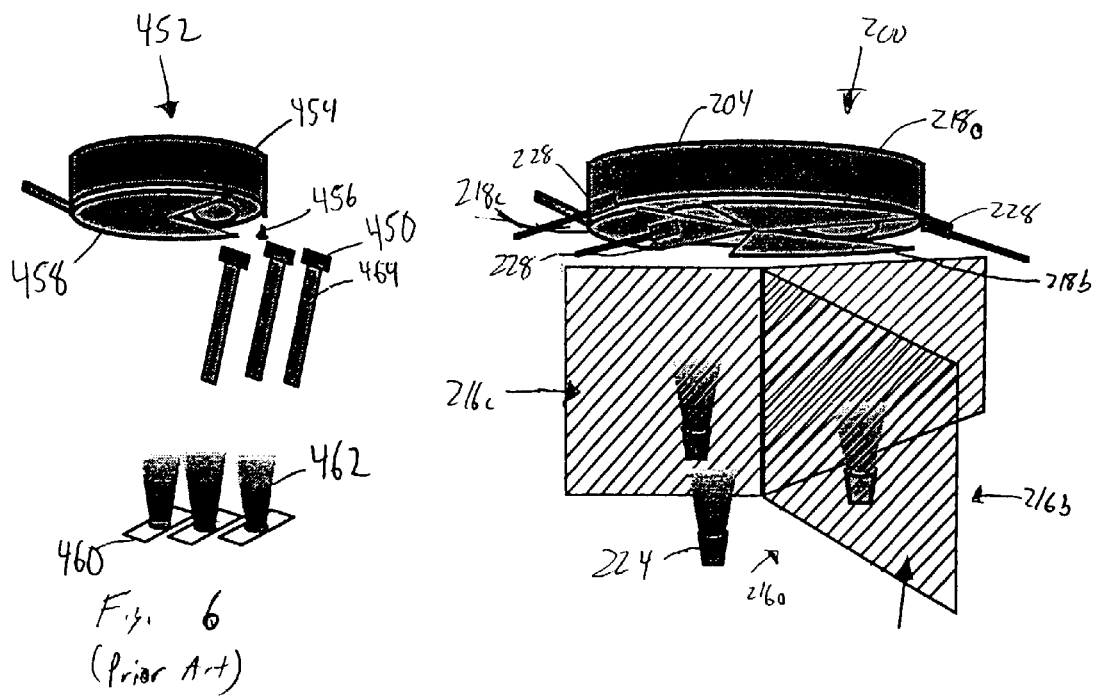
Fig. 6 (Prior Art)
Fig. 7

APPARATUS AND METHOD FOR DEPOSITION OF THIN FILMS

This application is a divisional of application Ser. No. 09/501,042, filed Feb. 9, 2000, now U.S. Pat. No. 6,527,866 which application(s) are incorporated herein by reference.

FIELD OF THE INVENTION

This invention relates to an apparatus and method for deposition of thin films. In particular, the invention relates to an apparatus and method for deposition of multicomponent (e.g., three or more components) oxide thin films, such as superconducting oxide films.

BACKGROUND OF THE INVENTION

Since the discovery, in 1986, of high temperature superconductors of the perovskite family, considerable effort has been directed to the development of methods of forming highly aligned thin films of these superconductors on substrates. As the technology develops from research to commercialization of systems incorporating high temperature superconductors, a need has arisen for deposition systems suitable for commercial-scale manufacture. Such systems should be suitable for large-area deposition and should produce uniform films, both on a single substrate and between substrates. The films produced should be smooth and highly oriented, with a high critical temperature, $T_c$, and high critical current density, $j_c$.

One conventional method of forming superconducting films includes co-evaporation of metals, such as yttrium, barium, and copper, followed by oxidation of the deposited metals. This method can be termed "reactive co-evaporation". The composition of the vapor in the co-evaporation chamber can be monitored or controlled using quartz-crystal monitors and a feedback device. The substrates upon which the film is to be formed are held in a rotating carousel and spaced from thermal boats that contain the material to be deposited. The substrates rotate between a deposition zone where they are exposed to mixed oxide vapors and an oxidation zone where the film is oxidized to form a superconductive oxide. The vapor pressure in the oxidation and deposition zones may differ by several orders of magnitude with very low pressures in the deposition zone. Typically, a layer with less than one unit cell thickness is formed during each rotation. The rotation allows for fast mixing of species on an atomic scale to produce a desired compound.

This method has several disadvantages. First, the thermal boats for the different materials must be close together to obtain a homogenous vapor. This limits the size of the thermal boats. Second, because the quartz-crystal monitors are not species specific, it is necessary to isolate the vapors seen by each monitor. This requires that the monitoring be done in the vicinity of the boats, rather than near the substrate. Third, the method does not allow for rapid cooling or convenient loading and unloading of the substrates. This decreases system throughput.

SUMMARY OF THE INVENTION

Generally, the present invention relates to methods and devices for forming thin films on a substrate. One embodiment is an apparatus including a deposition/reaction vessel and a holder for holding at least one substrate. The deposition/reaction vessel has at least three zones, each zone being separated from adjacent zones by a wall. The zones include at least two deposition zones, where each deposition zone is configured and arranged to deposit a deposition material on the substrate(s), and at least one reaction zone for reacting the deposition material with a reactant. The apparatus is configured and arranged to rotate the substrate(s) sequentially through the plurality of zones to form a thin film on the substrate(s). In some embodiments of the apparatus, the deposition/reaction vessel includes the same number of deposition zones and reaction zones. This configuration can include alternating deposition and reaction zones. In some instances, the holder is configured and arranged to hold substrates of different lateral dimensions.

Another embodiment is a method of forming a thin film layer on a substrate. A substrate is disposed in a holder and the holder is disposed in a deposition/reaction vessel. The deposition/reaction vessel includes at least three zones, each zone being separated from adjacent zones by a wall. The zones comprise at least two deposition zones and at least one reaction zone. The substrate is rotated through the zones. A deposition material is deposited on the substrate in each deposition zone. The deposition material is reacted with a reactant in each reaction zone. In some embodiments, a different deposition material is deposited in each of the deposition zones.

The above summary of the present invention is not intended to describe each disclosed embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIG. 3 is a schematic top view of a first embodiment of a substrate holder for use in the apparatus of FIG. 1;

FIG. 4 is a schematic top view of a second embodiment of a substrate holder for use in the apparatus of FIG. 1;

FIG. 6 is a schematic view prior art apparatus for depositing a thin film;

FIG. 7 is a schematic perspective view of a second embodiment of an apparatus for depositing thin films, according to the invention;

FIG. 8 is a schematic bottom view of an embodiment of a substrate holder for use in the apparatus of FIG. 7 indicating position of reaction and deposition zones relative to the substrate holder at one point in time;

Figure 5A:
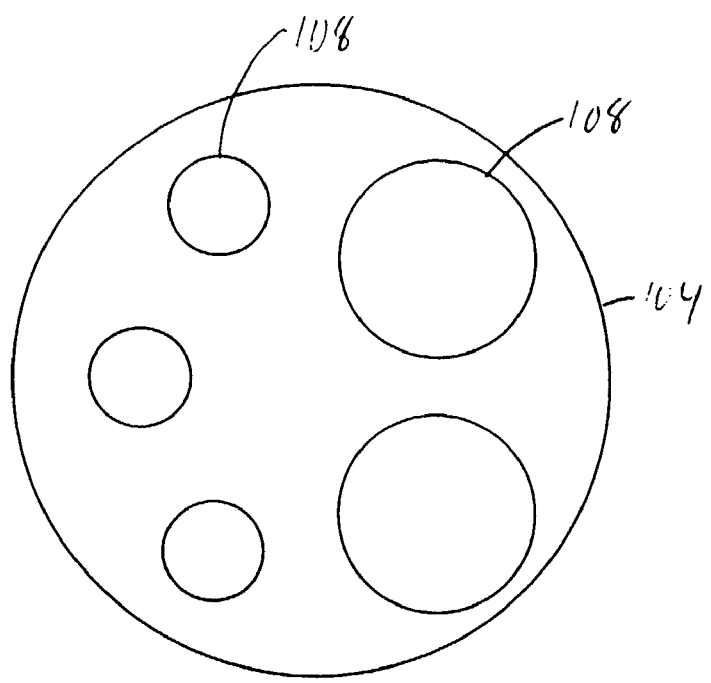
FIG. 5A is a schematic top view of a third embodiment of a substrate holder for use in the apparatus of FIG. 1.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION OF THE PREFERRED EMBODIMENT

The present invention is believed to be applicable to the formation of multicomponent (e.g., three or more components) thin films. In particular, the present invention is directed to devices and methods for forming thin films of alloys and compounds such as, for example, superconducting oxides (e.g., yttrium barium copper oxide (YBCO)). While the present invention is not so limited, an appreciation of various aspects of the invention will be gained through a discussion of the examples provided below.

An apparatus for forming a thin film typically includes a reaction/deposition vessel (e.g., chamber) and a substrate holder that holds at least one substrate upon which a thin film is to be formed. The reaction/deposition vessel is divided into at least three zones including at least two deposition zones and at least one reaction zone. A deposition material is deposited on the substrate(s) in each deposition zone and the deposition material is reacted with a reactant in each reaction zone. Each zone is typically separated from the others by at least one wall.

Each substrate is rotated sequentially through each of the zones at least once, and, typically, more than once, to deposit the deposition material and react the deposition material with the reactant to form a thin film. This apparatus can be used to form thin films of, for example, superconducting and other oxides, such as, for example, ferroelectrics, tunable dielectrics, and colossal magnetoresistance (CMR) materials. Examples of thin films that can be formed include yttrium barium copper oxide (YBCO), bismuth strontium calcium copper oxide (BSCCO), and other superconductors, as well as potassium niobate, lithium niobate, strontium titanate, barium titanate, yttria-stabilized zirconia (YSZ), and lanthanum aluminum oxide. The method and device can be used to form other materials including, for example, other tantalates, tungstates, titanates, cuprates, manganates, aluminates, and other metal oxides. In addition, nitrides can be formed using, for example, nitrogen or ammonia in the reaction zones instead of oxygen.

As one example, to form a YBCO thin film, the apparatus includes at least three deposition zones that independently deposit yttrium, barium, and copper, respectively. The deposition rates for each of these components can be chosen to obtain a particular stoichiometry of the thin film. In one or more reaction zones, the deposited metals are oxidized in the presence of an oxidant, such as oxygen gas, to form the superconducting oxide YBCO.

Figure 1:
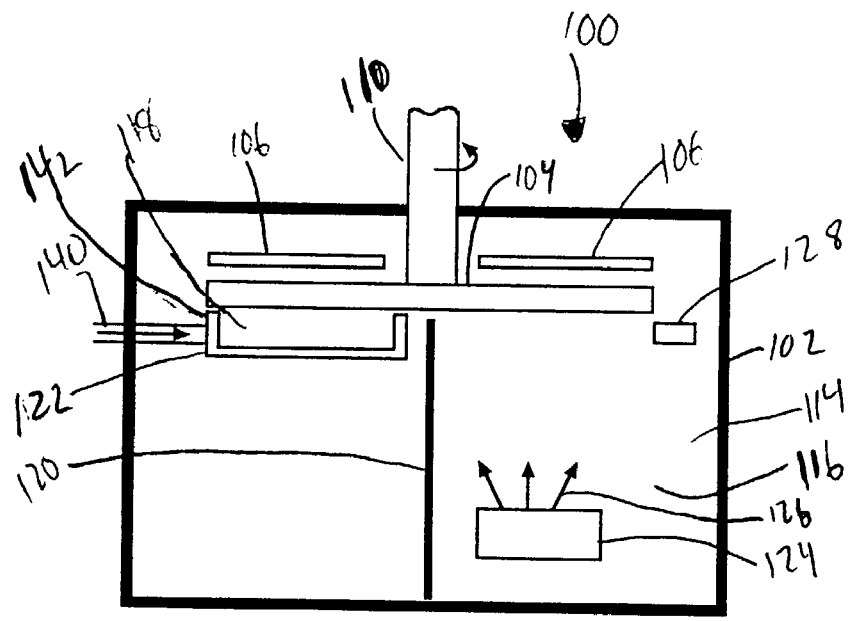
FIG. 1 is a schematic cross-sectional view of a first embodiment of an apparatus for depositing thin films, according to the invention.
Figure 2:
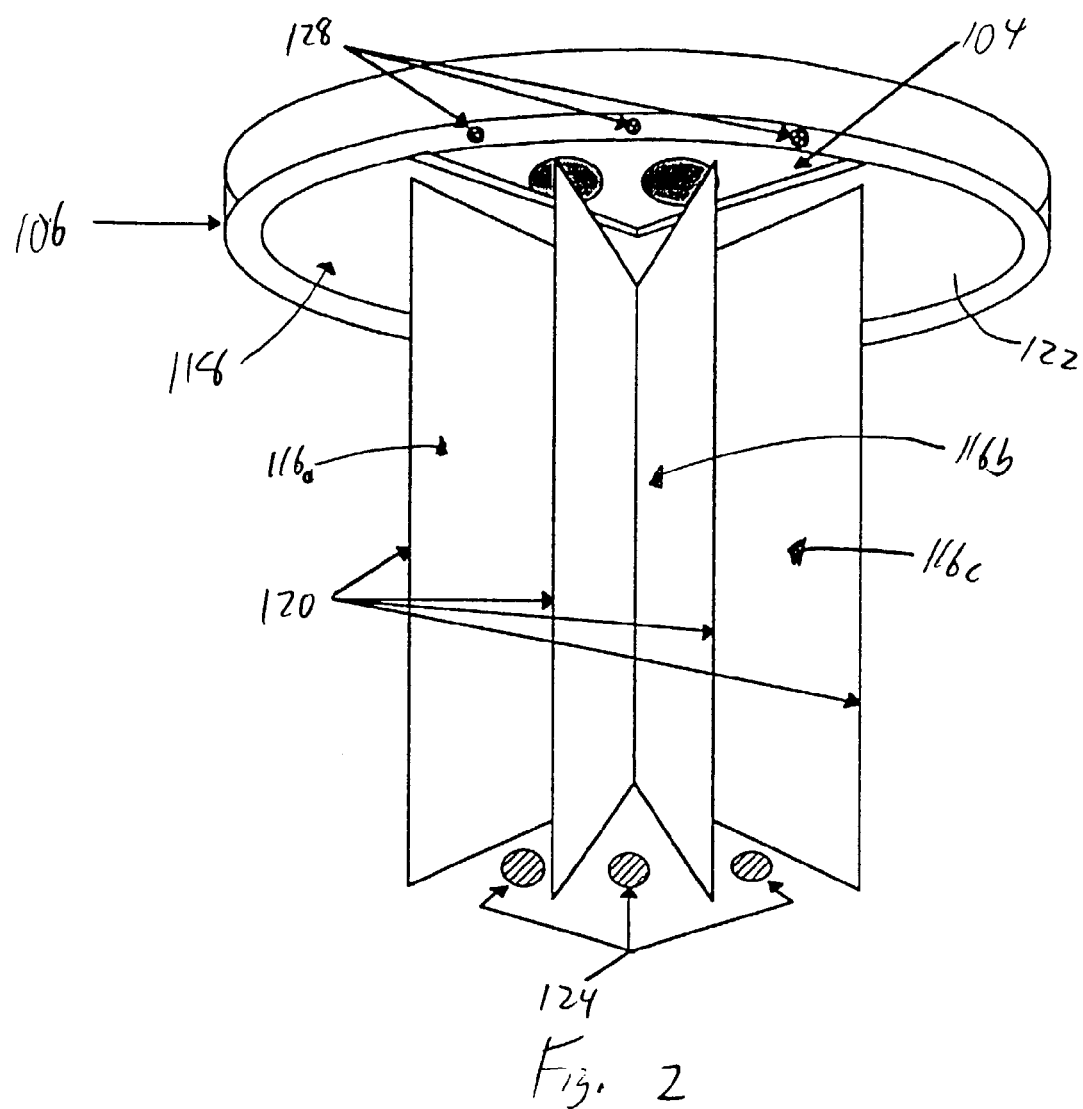
FIG. 2 is a perspective view of a portion of the apparatus of FIG. 1.

One example of a suitable apparatus for forming a thin film is illustrated schematically in FIGS. 1 and 2. The apparatus 100 includes a deposition/reaction vessel 102, a substrate holder 104, and, typically, at least one substrate heater 106 (or the deposition/reaction vessel 102 may be used as the heater). Typically, these items are made using a metal with high temperature and oxidation resistance, such as stainless steel, Inconel, or Haynes alloy. Haynes alloy (e.g., Haynes 214 alloy) is particularly suitable because of its high temperature oxidation resistance. Inconel alloy (e.g., Inconel 601 alloy) is also particularly suitable, but may be less resistant to high temperature oxidation. The substrate holder 104 has one or more openings 108 into which a substrate can be placed, as shown in FIGS. 3, 4, 5A, and 5B.

The substrates can be made from a variety of different materials including, for example, sapphire, silicon, gallium arsenide, magnesium oxide, lanthanum aluminum oxide, strontium titanate, or yttria-stabilized zirconia. A buffer material, such as, for example, magnesium oxide or cerium oxide, can be formed on the substrate prior to placing the substrate in the substrate holder. In some embodiments, the buffer material is placed on the substrate using the same methods and apparatus 100 described below.

The thickness of the substrate can be, for example, 0.1 to 5 mm. The lateral dimension (i.e., width or diameter) of the substrate can be, for example, 1 to 25 cm. One example of a suitable substrate has a thickness of 0.5 mm and a lateral dimension of 5 to 10 cm. However, the thickness and lateral dimension of the substrates can be larger or smaller and can depend on the particular application for which the thin film is formed.

Figure 5B:
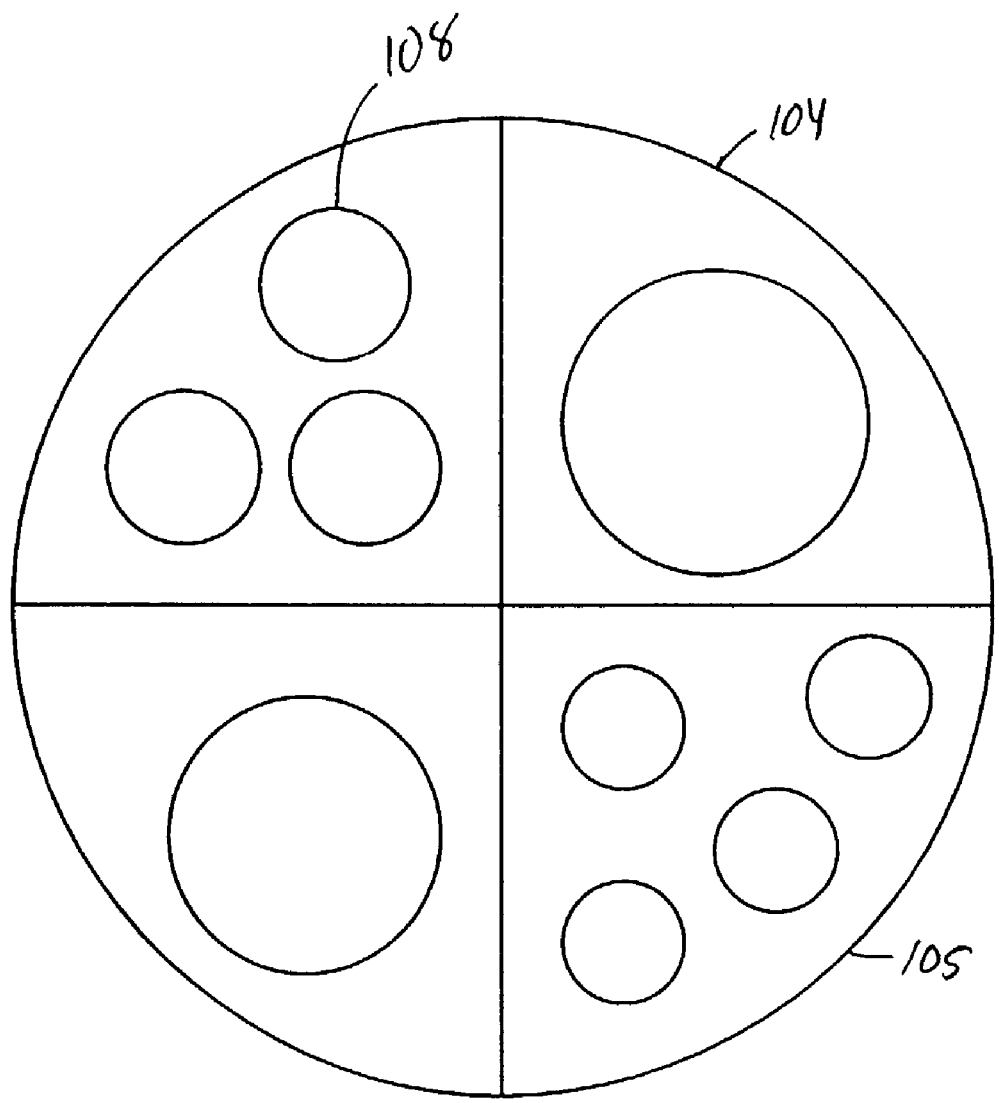
FIG. 5B is a schematic top view of a fourth embodiment of a substrate holder for use in the apparatus of FIG. 1.

The openings 108 in the substrate holder 104 can be the same size, as shown in FIGS. 3 and 4, or can be of different sizes (i.e., have different lateral dimensions), as shown in FIGS. 5A and 5B. For example, a single holder may be used to hold both 2 inch (about 5 cm) and 4 inch (about 10 cm) substrates. The use of substrate holders with different size openings may increase the ease of manufacture of substrates with different dimensions. In some embodiments, the substrate holder 104 includes several independent subsections 105, as illustrated in FIG. 5B, that can be mixed and matched as needed. For example, the substrate holder can be divided into three or four independent subsections that can hold 5 or 10 cm wafers as desired or needed. The wafers can be held in the substrate holder using a variety of mechanisms including, for example, a ring around the periphery of the substrate upon which the substrate sits or holding clips provided around the periphery of the substrate.

In some instances, the substrate holder 104 has a central region 112 (see FIG. 3) for coupling to one or more rotation/support members 110 (see FIG. 1) that rotate the substrate holder or hold the substrate holder in place as the deposition/reaction vessel 102 is rotated. Examples of suitable rotation/support members 110 include armatures, rods, shafts, one or more arms extending from a central shaft, and the like. In other instances, the one or more rotation/support members can be coupled to a different region of the substrate holder, such as, for example, the edge or periphery of the substrate holder. In yet other instances, at least one rotation/support member is coupled to the center of the substrate holder and at least one rotation/support member is coupled to the edge or at the periphery of the substrate holder.

The substrate holder can be coupled to the rotation/support members 110 by welding, or otherwise joining the members to the substrate holder 104. Alternatively or additionally, the substrate holder and/or the rotation/support members can include one or more gripping, holding, or fastening devices for attachment to the substrate holder. In yet other instances, the substrate holder and the one or more rotation/support members are integrally formed as a single unitary piece. In other instances, the substrate holder 104 can be coupled to the rotation/support members 110 by providing a holding tray as part of the rotation/support members 110. The substrate holder 104 is placed in the holding tray and, typically, held in place using clips, screws, bolts, or other retaining devices. This allows removal of the substrate holder to provide access for easy loading and unloading of substrates.

In embodiments in which the substrate holder is rotated during operation, the one or more rotation/support members 110 are typically coupled to a rotation device (not shown), such as, for example, an electric servo motor or stepper motor, that imparts rotational motion to the one or more rotation/support members 110 and consequently to the substrate holder 104. An example of a suitable substrate holder and rotation/support member for rotating the substrate holder is illustrated in PCT Patent Application No. WO 98/20521 and U.S. Pat. No. 5,554,224, incorporated herein by reference.

During operation, the deposition/reaction vessel 102 is typically coupled to a vacuum generating device (not shown), such as, for example, a vacuum pump, e.g., a cryopump or molecular turbo pump, to maintain a desired level of pressure in the chamber. During operation, the pressure in the deposition zone(s) of the deposition/reaction chamber near the substrate(s) in the substrate holder 104 is typically in the range of, for example, 0.0001 to 0.01 Pa. The use of a vacuum facilitates the deposition of material on the substrates in the substrate holder 104. The presence of molecules in the ambient atmosphere can reduce the amount of material deposited on the substrate(s) by, for example, deflecting the deposition material. The molecules in the ambient atmosphere can also generate unwanted reaction products, such as oxidation products, with the deposition material. The vacuum generating device is typically continuously operated during the deposition process, particularly if the reactant in the one or more reactions zones is a gaseous material, such as molecular oxygen, that can leak into the deposition zones.

A heater 106 is typically provided in proximity to the substrate holder 104 to heat the substrate(s), particularly during reaction of the deposition material with the reactant in the one or more reaction zones 118. Alternatively, the entire deposition vessel can be used as a heater. This configuration allows heating from both the top and bottom of the substrate and keeps the temperature relatively uniform.

To form YBCO, the heater can heat the substrate to a temperature in the range of, for example, 600 to 800° C., and typically in the range of 650 to 750° C. Other temperature ranges can be used to form other thin films. The temperature depends on factors such as, for example, the type of material being deposited, the activity of the reactant, the reaction rate between the reactant and the deposition material, and the desired product of the reaction. The temperature in each zone can be the same or different.

Rotation of the substrate through the zones can result in temperature fluctuations particularly between the reaction zones and the deposition zones. The reaction zones, at least in the illustrated embodiments, have less volume than the deposition zones and, therefore, the reaction zones can be maintained at a higher temperature, for a given heater output, than the deposition zones. In some instances, these temperature fluctuations are allowable, for example, if deposition of the deposition material can be adequately performed at temperatures below those needed for reaction of the deposition material with the reactant. In other instances, the substrate(s) are rotated at a rate that decreases or eliminates substantial temperature fluctuations. Typically, no substantial temperature fluctuation has been observed at a rotation speed of about 1 Hz or more.

Also, in some embodiments, the use of multiple reaction zones spaced apart by deposition zones can reduce temperature fluctuations as opposed to a single reaction zone and sequential deposition zones. The reduction of temperature fluctuations in these embodiments is due, at least in part, to the reduced amount of space between reaction zones, which permits less time for fluctuation of the temperature.

As indicated above, the deposition/reaction vessel 102 is typically divided into zones 114, including at least two deposition zones 116 and at least one reaction zone 118. In operation, the substrate holder 104 is rotated (or the deposition/reaction vessel 102 rotates while the substrate holder 104 remains still) sequentially through each of the zones 114. The speed of rotation can be, for example, 1 to 20 Hz, and is typically, 2 to 10 Hz. The substrate(s) make at least one or more complete rotations and, typically, at least 1000 or more complete rotations. For example, at least 2500 rotations have been used to form a 100 nm thick film at a rotation speed of 5 Hz providing a deposition rate of about 0.2 nm/s. A 500 nm film would require at least 12500 rotations under these conditions.

The zones are typically divided by vertical walls 120 and/or horizontal walls 122, although, in some embodiments, walls are not placed between two or more of the deposition zones if the substrates rotate through a reaction zone between each of the deposition zones. The embodiment illustrated in FIG. 2 includes three deposition zones 116a, 116b, 116c and one reaction zone 118.

Each deposition zone 116 includes one or more sources 124 of deposition material 126. The deposition material is typically a metal species, although other materials can also be used. Examples of suitable sources 124 include boats of current heated metal strips, e-gun evaporators, and effusion cells. Other sources and physical vapor deposition methods, such as sputtering, can be used. Examples of suitable metal species include yttrium, barium, copper, strontium, zirconium, titanium, lithium, potassium, niobium, and other main group metals, transition metals, and lanthanide or actinide series metals and metal species. Typically, any material that can be evaporated can be used.

The rate of deposition of any particular metal or metal species can range from, for example, 0.1 to 10 Angstroms/second and is typically 0.5 to 5 Angstroms/second. The rate of deposition depends on a variety of factors including, for example, the rate of rotation, the temperature of the sample, and the rate at which deposition material is discharged by the source 124. The deposition rate can affect stoichiometry of the thin film. The deposition rates of the various components can be adjusted to obtain a particular stoichiometry.

Typically, deposition is performed in a vacuum of at least 0.01 Pa to facilitate the transfer of material from the source 124 to the substrates in the substrate holder 104 without substantial interference with the deposition material by the ambient atmosphere. Deposition is adversely affected by other molecules in the ambient around the substrate holder 104 which can deflect and/or react with the deposition material.

In at least some instances, all of the sources 124 in a particular deposition zone 116 provide the same deposition material 126, so that a single deposition material is deposited on the substrates within the deposition zone 116. However, in other instances, deposition sources providing different deposition materials can be used in a single deposition zone.

The size of the deposition zones can be the same or different. In particular, the relative sizes of the deposition zones may be chosen to obtain a desired ratio of components in the deposited composition. For example, if the composition contains $A_{1-x}B_x$, where x is small, the deposition zone for the component B could be smaller than the deposition zone for the A component. The relative ratios of components to obtain desired composition can also be controlled by using different vapor pressures. The relative reaction rates of the materials may also be considered in designing a system for obtaining a particular thin film composition.

The method in which each of the deposition zones deposits a different deposition material can be referred to as "reactive sequential evaporation". This is different than the previous method of "reactive co-evaporation" in which all the deposition materials are deposited from a single deposition zone. Reactive sequential deposition is used to form compounds by, e.g., intimate atomic mixing of elements. As an example, one deposition zone 116a deposits yttrium on the substrate; a second deposition zone 116b deposits copper on the substrate; and a third deposition zone 116c deposits barium on the substrate. These three materials can then be oxidized in the reaction zone 118 to form yttrium barium copper oxide. An advantage of using individual deposition zones for each deposition material is that the source can be larger than could be used for a device having a single deposition zone for depositing all of the types of deposition material. In addition, the deposition rate of each deposition material can be better monitored or controlled without interference from the other deposition materials.

At least one deposition material monitor 128 is typically provided in each deposition zone 116. The deposition material monitor 128 is used to monitor or maintain a constant deposition rate. The deposition material monitor 128 measures at least one of, for example, the deposition rate of deposition material on the substrate or the amount of material in the chamber (which is also typically indicative of the deposition rate on the substrate). Examples of suitable deposition material monitors 128 include quartz crystal monitors, mass spectrometers, and atomic absorption monitors. Suitable quart crystal monitors (QCM) include, for example, Leybold Inficon IC/5 Thin Film Deposition Controllers with a standard QCM head and a 6 MHz quartz crystal (Leybold Inficon, East Syracuse, N.Y.) or Sentinel III Thin Film Deposition Controllers (Leybold Inficon, East Syracuse, N.Y.). The quartz crystal monitors are typically more convenient, but can not distinguish between different deposition materials and require regular maintenance. Thus, using deposition zones that are separated by a wall can significantly improve the monitoring of individual deposition rates.

Figure 10:
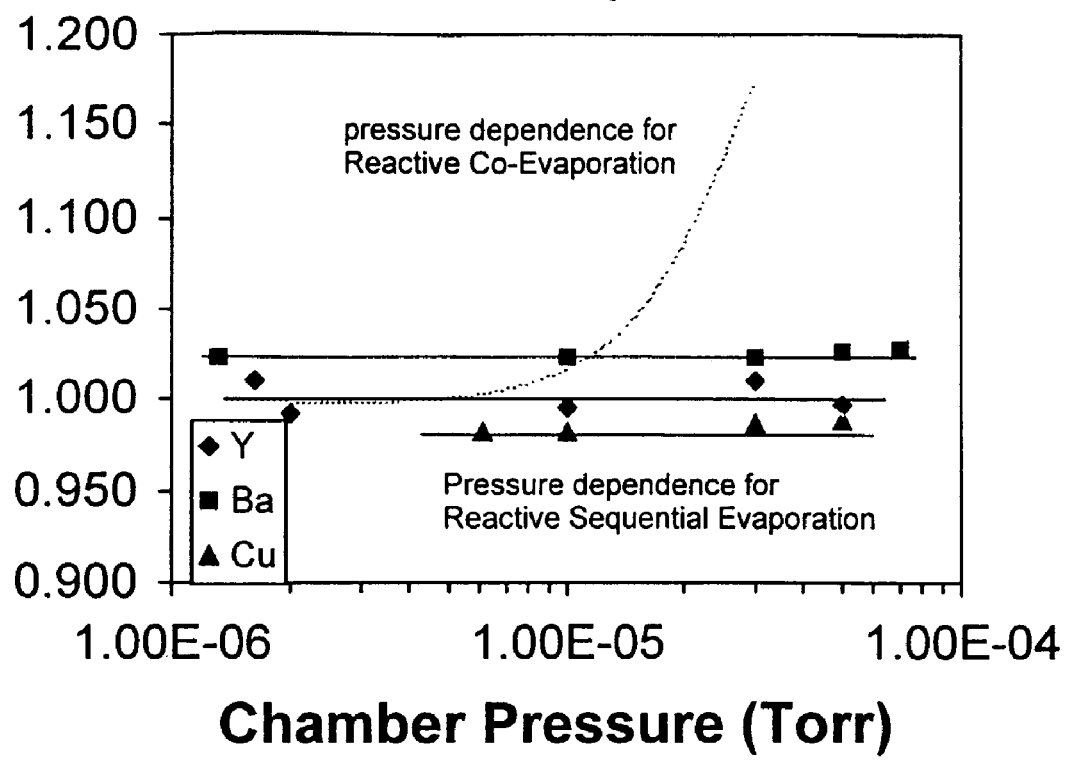
FIG. 10 is a graph illustrating the pressure dependence for reactive sequential evaporation and reactive co-evaporation.

Deposition material monitors 450, such as quartz crystal monitors, have been used in conventional deposition devices 452, as illustrated in FIG. 6. This conventional deposition device 452 includes a rotating substrate holder 454, one deposition zone 456, and one reaction zone 458. Within the deposition zone 456 are multiple sources 460 that deposit different deposition materials 462 on the substrate. However, because these conventional devices 452 include two or more deposition materials in a single deposition zone 456, the monitors 450, which are not source- or material-selective, must be placed near the deposition material sources and/or must include a collimator 464 directed toward and having an opening near the source to obtain an accurate reading for the source. This arrangement has a number of disadvantages, including, for example, that the monitor and/or collimator opening is placed close to the source, and not the substrate(s). Thus, the monitors observe the conditions near the sources and not the substrate(s). In addition, the collimators need to be adjusted precisely to ensure accurate measurements for a particular deposition material. Moreover, the monitors and/or collimators shadow some of the substrate because of their positioning. Furthermore, the gas pressure inside the collimators may not be representative of the pressure within the deposition zone. Also, the pressure of the deposition material inside the collimators may not be representative of the pressure within the deposition zone and/or changes in the pressure within the deposition zone may not be timely registered within the collimator. FIG. 10 illustrates the temperature dependence of the "reactive sequential evaporation" method disclosed herein and the previously known "reactive co-evaporation" method. This shows that the use of collimators can result in measurements by the quartz crystal monitor (QCM) that do not accurately reflect the actual reaction rate at the wafer.

In contrast, when the zones are separated and only one deposition material is deposited in each zone, as illustrated in FIGS. 1 and 2, the deposition material monitor 128 can be placed near the substrate because there is only one deposition material. This also allows for freedom in placing the deposition material monitor(s) 128 relative to the substrate to reduce or eliminate shadowing. For example, the monitor(s) can be placed along the periphery of the substrate holder 104 (as shown in FIG. 1) or near the center of the substrate holder to reduce or eliminate shadowing.

In each reactant zone 118, the previously deposited material is reacted with a reactant to form the thin film material. Examples of suitable reactants include oxidizers, such as molecular oxygen ($O_2$), ozone ($O_3$), nitrous oxide ($N_2O$), nitric oxide (NO), and nitrogen dioxide ($NO_2$) to form oxides and nitriding agents, such as nitrogen ($N_2$) or ammonia ($NH_3$), to from nitrides. For example, deposited yttrium, barium, and copper can be oxidized by molecular oxygen in the reaction zone to form yttrium barium copper oxide. Typically, the reactant is a gaseous material that is introduced via a conduit 140 into the reaction zone 118.

Because the reaction material is gaseous, the reaction material can adversely affect the pressure in the reaction/deposition vessel 102 by flow of the reaction material through any open space between the reaction zone and adjacent deposition zone(s). One structure used to reduce the leakage of reactant into the reaction/deposition vessel 102 is illustrated in FIG. 1. In this embodiment, the reaction zone 114 includes a chamber 142 enclosed on all sides by walls except for the top side which is exposed to the substrate holder 104 and substrates. The walls of the chamber 142 extend close to, but not touching, the substrate holder 104. This reduces the space through which reactant gas can leak into the remainder of the reaction/deposition vessel 102, while allowing the substrate holder 104 (or reaction/deposition vessel 102) to rotate freely. This allows for low pressure deposition of the deposition materials and high pressure (relative to the deposition zones) reaction of the deposition materials with the reactant.

In some instances, either the chamber 142 or the substrate holder 104 and rotation/support members 110 is movable to permit adjustment of the gap between the walls of the chamber 142 and the substrate holder 104. For example, the substrate holder 104 can be held using a bellows arrangement or some other adjustable arrangement that can be adjusted to move the substrate holder up or down to reduce the space between the substrate holder and the chamber walls, while still allowing free rotation. In some embodiments, the gap between the substrate holder 104 and the walls of the chamber 142 is no more than 2 mm and can be 0.5 mm or less. Typically, this adjustment is made prior to beginning the deposition process.

The pressure within the chamber 142 can also be chosen to reduce the leakage of reactant gas into the reaction/deposition vessel 102. In some instances, decreasing the reaction temperature permits the use of reactants at lower pressures. In the formation of YBCO, the pressure of the reactant gas can range from, for example, 0.5 to 20 Pa. This is typically one to three orders of magnitude or more higher than the pressure in the deposition zones.

Another embodiment of a suitable device is illustrated in FIGS. 7 and 8. This device 200 is similar to the devices 100 including a reaction/deposition vessel (not shown), substrate holder 204, and heater (not shown). In this device 200, there are three deposition zones 216a, 216b, 216c and three reaction zones 218a, 218b, 218c. Vertical walls 220 (i.e., shields) separate the deposition zones 216a, 216b, 216c and each reaction zone is formed within a chamber 242a, 242b, 242c, as described above for the embodiment illustrated in FIG. 1.

In at least some instances, each of the deposition zones deposits a different deposition material using sources 224a, 224b, 224c. As an example, one deposition zone 216a deposits yttrium on the substrate; a second deposition zone 216b deposits copper on the substrate; and a third deposition zone 216c deposits barium on the substrate. An advantage of using individual deposition zones for each deposition material is that the source can typically be larger than could be used for a device having a single deposition zone for depositing all of the types of deposition material. In an alternative embodiment, two or more deposition materials are deposited in a particular deposition zone.

In this device 200, the substrates alternate between a) deposition of a deposition material and b) reaction of the deposition material with a reactant. Each reaction zone has an individual source of reactant and the reactant in each reaction zone can be the same or different. In addition, the pressure and amount of reactant can be the same or different in each reaction zone, for example, the pressure and amount of reactant can be tailored for a specific reaction of the deposition material deposited on the substrate in the immediately preceding deposition zone. Alternatively, two or more of the reaction zones can be connected, for example, around the perimeter of the substrate holder to provide the same reactant and/or pressure of reactant within all of the connected reaction zones. In this embodiment, there are one or more reactant feeds.

One or more heaters can be used. A single heater can be used to provide a single temperature. Alternatively, different heaters or heating zones can be provided to tailor the temperature to the particular desirable reaction or reaction rate in a particular reaction zone.

One or more deposition material monitors 228 are also typically provided in each deposition zone 216a, 216b, 216c to monitor deposition material concentration and/or rate of deposition. As illustrated in FIG. 8, placement sites for the deposition material monitors include, for example, beyond the peripheral edge of the substrate holder 204, towards the center of the substrate holder 204 where no substrate is positioned, and/or beneath a portion of the chamber 242 of the reaction zone 218 which overlaps with the deposition zone 216. In all three cases, the deposition material monitor 228 can be positioned in proximity to the substrate upon which the deposition material is to be deposited without shadowing or otherwise blocking access to the substrate in the substrate holder 204.

Figure 9:
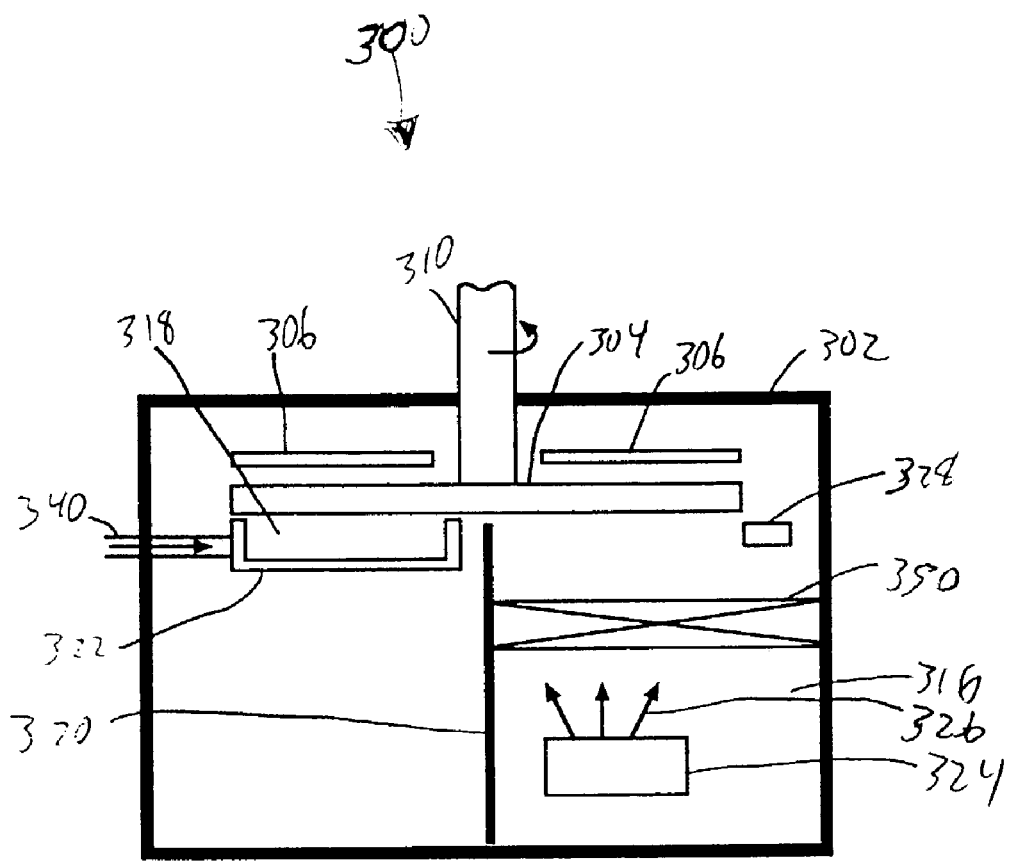
FIG. 9 is a schematic cross-sectional view of a third embodiment of an apparatus for depositing thin films, according to the invention.

FIG. 9 illustrates yet another embodiment of an apparatus 300 for forming a thin film on a substrate. The apparatus 300 includes a reaction/deposition vessel 302, a substrate holder 304, one or more substrate heaters 306, at least one rotation/support member 110, two or more deposition zones 316, at least one reaction zone 318, wall 320 separating the zones, a chamber 322 for each reaction zone, a source 324 of deposition material 326, at least one optional deposition material monitor 328, and a conduit 340 for the reactant. These items can be the same as described above for apparatus 100 and apparatus 200, including all of the variations described above.

The apparatus 300 also includes a valve 350 in at least one of the deposition zones 316, and can have a valve for each of the deposition zones. The valve 350 is open when depositing material on the substrates held in the substrate holder 304. The valve 350 is closed after deposition to seal the source 324 of deposition material 236 within a low pressure environment, so that the substrate holder 304 can be removed. This may be particularly advantageous if the source 324 is sensitive to materials in the ambient atmosphere. In particular, some deposition materials, such as barium or strontium, react with water or oxygen and need to be protected from exposure to air. Suitable valves include vacuum gate valves available from MDC, Hayward, Calif. (High Vacuum Gate Valves) or VAT, Switzerland (Series 14 or Series 10 gate valves). In addition, this arrangement can be used to reduce cycling time between groups of substrates where a first group is removed after formation of the thin film and replaced by a second group, particularly if the valve closes off a relatively large portion of the deposition/reaction vessel 302 from exposure to the external atmosphere as the substrates are removed.

In operation, the valve 350 is typically closed while the substrates and/or substrate holder 304 is placed in the deposition/reaction vessel 302. When the deposition/reaction vessel 302 is closed, air can be removed from the region proximate to the substrate holder 304 prior to opening the valve 350 or the valve 350 can be opened and then the pressure reduced by the vacuum generating device. The thin film is then formed by deposition material in the deposition zones and reacting the deposition material with a reactant in the reaction zones. After the thin film is formed on the substrate, the valve 350 is closed and the substrates and/or substrate holder removed.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification.

What is claimed is:

1. A method of forming a layer on a substrate, comprising: disposing the substrate in a holder and disposing the holder in a deposition/reaction vessel comprising a plurality of zones, each zone being separated from adjacent zones by a wall, wherein the walls separating the plurality zones are connected, the plurality of zones comprising at least two deposition zones and at least one reaction zone; heating the substrate with a heater located proximate the substrate; repeatedly rotating the substrate through the plurality of zones; depositing, in each deposition zone, a deposition material on the substrate; and reacting, in each reaction zone, the deposition material on the substrate with a reactant.

2. The method of claim 1, wherein disposing the substrate in a holder comprises disposing a substrate in a holder and disposing the holder in a deposition/reaction vessel comprising a plurality of zones, each zone being separated from adjacent zones by a wall, the plurality of zones comprising a same number of alternating deposition zones and reaction zones.

3. The method of claim 1, wherein depositing a deposition material comprises depositing a different deposition material on the substrate in each deposition zone.

4. The method of claim 1, wherein reacting the deposition material comprises oxidizing the deposition material.

5. The method of claim 1, wherein reacting the deposition material comprises reacting the deposition material with a reactant to form a superconductor material.

* * * * *